US006998917B2

(12) United States Patent
Kudo et al.

(10) Patent No.: US 6,998,917 B2
(45) Date of Patent: Feb. 14, 2006

(54) COMMON-MODE FEEDBACK CIRCUIT AND DIFFERENTIAL OPERATIONAL AMPLIFIER CIRCUIT HAVING STABLE OPERATION AND LOW POWER CONSUMPTION

(75) Inventors: Masahiro Kudo, Kawasaki (JP); Kunihiko Gotoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 75 days.

(21) Appl. No.: 10/777,133

(22) Filed: Feb. 13, 2004

(65) Prior Publication Data

US 2004/0239425 A1 Dec. 2, 2004

(30) Foreign Application Priority Data

Mar. 11, 2003 (JP) ............................. 2003-065334
Nov. 19, 2003 (JP) ............................. 2003-389516

(51) Int. Cl.
*H03F 3/45* (2006.01)
(52) U.S. Cl. ...................... 330/258; 330/259; 330/260
(58) Field of Classification Search ......... 330/252–261
See application file for complete search history.

(56) References Cited

U.S. PATENT DOCUMENTS

| | | | | |
|---|---|---|---|---|
| 3,582,802 A | * | 6/1971 | Weekes et al. ............. | 330/258 |
| 5,006,817 A | * | 4/1991 | Babanezhad ............... | 330/253 |
| 5,008,632 A | * | 4/1991 | Sutterlin .................... | 330/256 |
| 5,568,089 A | | 10/1996 | Maru | |
| 5,568,561 A | * | 10/1996 | Whitlock ................... | 381/120 |
| 5,742,204 A | * | 4/1998 | Bell ........................... | 330/258 |
| 5,933,056 A | * | 8/1999 | Rothenberg ................ | 330/258 |
| 6,411,166 B1 | * | 6/2002 | Baschirotto et al. ........ | 330/258 |
| 6,774,722 B1 | * | 8/2004 | Hogervorst ................. | 330/258 |

FOREIGN PATENT DOCUMENTS

| | | |
|---|---|---|
| JP | 61-109309 | 5/1986 |
| JP | 6-232654 | 8/1994 |
| JP | 7-7340 | 1/1995 |
| JP | 7-273567 | 10/1995 |
| JP | 2884896 | 2/1999 |
| JP | 2000-357929 | 12/2000 |

\* cited by examiner

*Primary Examiner*—Peguy JeanPierre
*Assistant Examiner*—Khai M. Nguyen
(74) *Attorney, Agent, or Firm*—Arent Fox PLLC

(57) ABSTRACT

A common-mode feedback circuit outputs a control voltage to define a common-mode operating point of a fully differential amplifier. The common-mode feedback circuit has a voltage dividing circuit and a differential amplifier. The voltage dividing circuit divides a voltage across two output ends of the fully differential amplifier. The differential amplifier receives an output voltage of the voltage dividing circuit and a reference voltage, and an output voltage of the differential amplifier is supplied as the control voltage to the fully differential amplifier.

18 Claims, 12 Drawing Sheets

DOUBLE POLYSILICON CAPACITOR

MIM CAPACITOR

POLYSILICON-DIFFUSION LAYER CAPACITOR

MOS CAPACITOR

COMMON-MODE FEEDBACK CIRCUIT AND DIFFERENTIAL OPERATIONAL AMPLIFIER CIRCUIT HAVING STABLE OPERATION AND LOW POWER CONSUMPTION

CROSS REFERENCE TO RELATED APPLICATION

This application is based upon and claims the benefit of priority from the prior Japanese Patent Application Nos. 2003-065334, filed on Mar. 11, 2003 and 2003-389516, filed on Nov. 19, 2003, the entire contents of which are incorporated herein by reference.

BACKGROUND OF THE INVENTION

1. Field of the Invention

The present invention relates to a common-mode feedback circuit and a differential operational amplifier circuit, and in particular to a common-mode feedback circuit that outputs a control voltage for defining the common-mode operating point of a fully differential amplifier.

2. Description of the Related Art

In the prior art, there is proposed a common-mode feedback circuit that outputs a control voltage for defining the common-mode operating point of a fully differential amplifier. That is, a fully differential amplifier is a circuit that amplifies differential input voltages and outputs the amplified signals as differential output voltages, and this amplifier requires the provision of a common-mode feedback circuit for controlling the common-mode output voltage. The common-mode feedback circuit receives the non-inverting output (positive logic output) and inverting output (negative logic output) of the fully differential amplifier as input voltages, and generates a control voltage for controlling the common-mode operating point of the fully differential amplifier.

In the prior art, it is known to provide a common-mode feedback circuit in which the outputs of a fully differential amplifier are input via a voltage dividing circuit to a differential amplifier whose output is fed back to the fully differential amplifier (for example, with reference to Japanese Unexamined Patent Publication (Kokai) No. 61-109309 (FIG. 5)). In the prior art, there is also proposed a common-mode feedback circuit (differential operational amplifier circuit) in which the outputs (differential outputs) of a fully differential amplifier are received by two buffer circuits whose outputs are divided through a voltage dividing circuit to obtain a midpoint voltage (for example, with reference to Japanese Patent No. 2884896 corresponding to Japanese Unexamined Patent Publication (Kokai) No. 05-283952 (FIGS. 1 and 3)).

There is also proposed in the prior art a common-mode feedback circuit that holds the common-mode signal of the fully differential amplifier fixed accurately at a desired potential and can obtain a sufficiently high common-mode feedback gain (for example, with reference to Japanese Unexamined Patent Publication (Kokai) No. 06-232654). In another common-mode feedback circuit proposed in the prior art, stability is achieved without increasing load capacitance (for example, with reference to Japanese Unexamined Patent Publication (Kokai) No. 07-007340). In yet another common-mode feedback circuit proposed in the prior art, the circuit configuration is simplified by reducing the number of devices (for example, with reference to Japanese Unexamined Patent Publication (Kokai) No. 07-273567).

The prior art and its associated problems will be described later with reference to the accompanying drawings.

SUMMARY OF THE INVENTION

According to the present invention, there is provided a common-mode feedback circuit outputting a control voltage to define a common-mode operating point of a fully differential amplifier, comprising a voltage dividing circuit dividing a voltage across two output ends of the fully differential amplifier; and a differential amplifier receiving an output voltage of the voltage dividing circuit and a reference voltage, wherein an output voltage of the differential amplifier is supplied as the control voltage to the fully differential amplifier.

Further, according to the present invention, there is also provided a differential operational amplifier circuit comprising a fully differential amplifier, and a common-mode feedback circuit outputting a control voltage to define a common-mode operating point of the fully differential amplifier, wherein the common-mode feedback circuit comprising a voltage dividing circuit dividing a voltage across two output ends of the fully differential amplifier; and a differential amplifier receiving an output voltage of the voltage dividing circuit and a reference voltage, wherein an output voltage of the differential amplifier is supplied as the control voltage to the fully differential amplifier.

The differential amplifier may receive a midpoint voltage of the voltage dividing circuit and the reference voltage. The output voltage of the differential amplifier may be amplified or attenuated with an arbitrary sign. The sign of an amplification factor of the differential amplifier may be chosen so that a common-mode feedback system in the common-mode feedback circuit becomes a negative feedback system, based on a transfer function of an output common-mode voltage produced in response to the control voltage supplied to the fully differential amplifier.

The voltage dividing circuit may comprise two impedance circuits dividing the voltage across the two output ends of the fully differential amplifier; and one or more capacitive elements each connected between a fixed potential and a midpoint at which the voltage is divided by the impedance circuits.

The voltage dividing circuit may further comprise a capacitive element connected between a low voltage supply line and the midpoint at which the voltage is divided by the impedance circuits. The voltage dividing circuit may further comprise a capacitive element connected between a high voltage supply line and the midpoint at which the voltage is divided by the impedance circuits. Each of the impedance circuits may comprise a resistive element and a capacitive element connected in parallel. The impedance circuit may have a configuration equivalent to the voltage dividing circuit, and may be inserted between the differential amplifier and an input end of the reference voltage. The impedance circuit may be configured to exhibit an impedance equivalent to the impedance of the voltage dividing circuit, and may be inserted between the differential amplifier and an input end of the reference voltage.

A first pole in a common-mode loop transfer function may be dominantly caused by a pole attributable to the impedance circuits and the capacitive element in the voltage dividing circuit. A first zero in a common-mode loop transfer function may be dominantly caused by a zero attributable to the voltage dividing circuit, and may be located in the vicinity of or on a low frequency side of a unity gain frequency. The differential amplifier may comprise a differential pair and an active load, and a voltage that the active load outputs is supplied as the control voltage to the fully differential amplifier.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Before describing in detail the preferred embodiments of a common-mode feedback circuit (differential operational amplifier circuit) according to the present invention, prior art common-mode feedback circuits and their associated problems will be described with reference to the drawings.

In recent years, an amplifier having a cascode type output stage that exhibits a very large output impedance has come into wide use in the configuration of a fully differential amplifier, because a very large DC gain can be accomplished by employing the cascode configuration. A high input impedance is therefore required of a common-mode feedback circuit used for such an amplifier.

Figure 1:
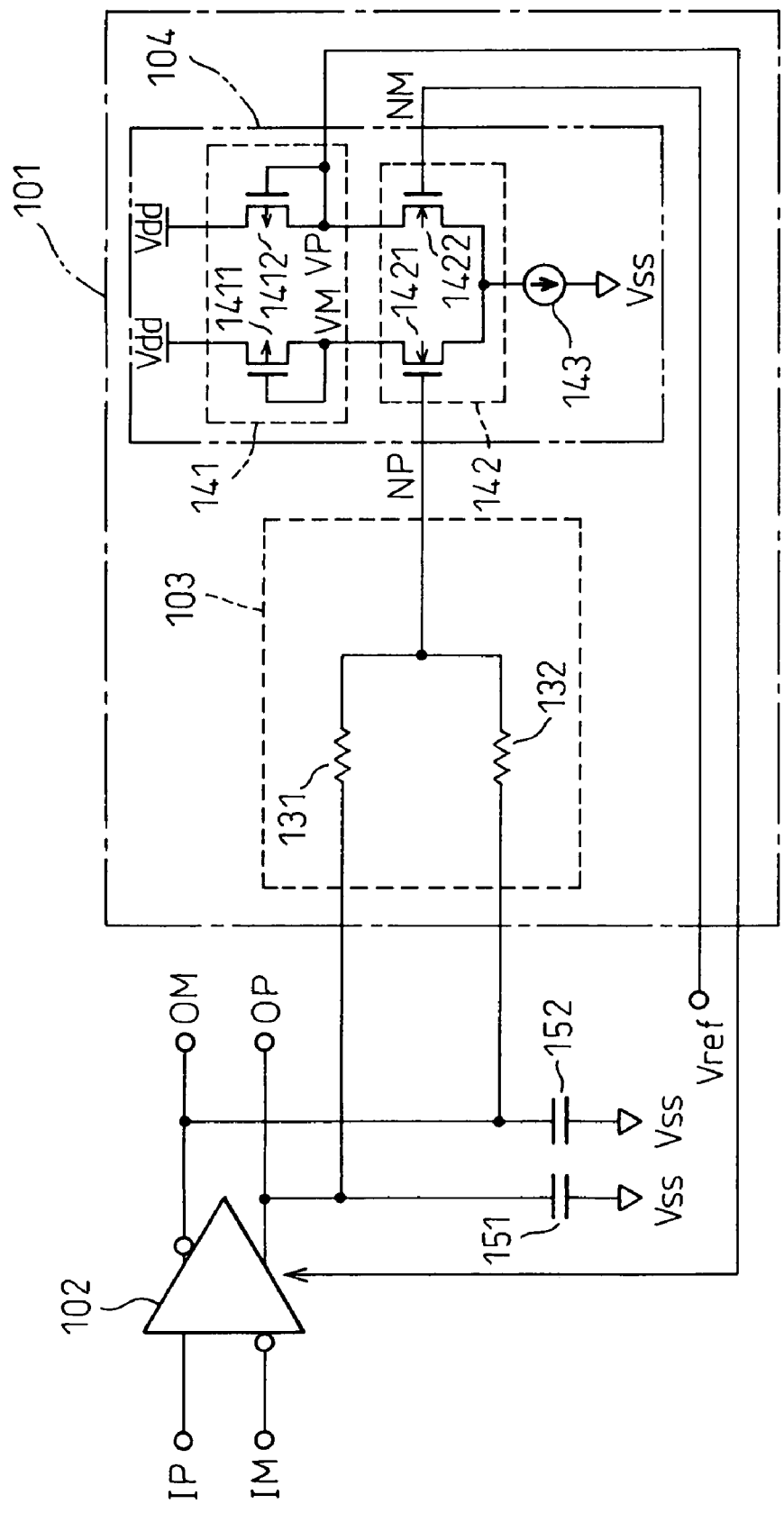
FIG. 1 is a circuit diagram showing one example of a prior art common-mode feedback circuit.

FIG. 1 is a circuit diagram showing one example of a prior art common-mode feedback circuit (differential operational amplifier circuit). In FIG. 1, reference numeral 101 is the common-mode feedback circuit, 102 is a fully differential amplifier, 103 is a voltage dividing circuit, and 104 is a differential amplifier. Further, reference characters IP and IM indicate differential (complementary) input terminals of the fully differential amplifier 102, OP and OM designate differential output terminals of the fully differential amplifier 102, and NP and NM represents differential input nodes of the differential amplifier 104.

As shown in FIG. 1, the common-mode feedback circuit 101 comprises the voltage dividing circuit 103 and the differential amplifier 104, and the voltage dividing circuit 103 comprises resistive elements 131 and 132. The differential amplifier 104 comprises an active load 141 constructed from p-channel MOS transistors (PMOS transistors) 1411 and 1412 with their gates connected to their drains, a differential pair 142 constructed from n-channel MOS transistors (nMOS transistors) 1421 and 1422, and a constant current source 143. Here, the output of the voltage dividing circuit 103 is coupled to the gate (node NP) of the transistor 1421 in the differential pair 142, while the gate (node NM) of the transistor 1422 in the differential pair 142 is supplied with a reference voltage Vref.

In the above common-mode feedback circuit 101, if the resistance values of the resistive elements 131 and 132 in the voltage dividing circuit 103 are increased in order to increase the input impedance, the phase margin of the common-mode feedback system reduces and the circuit operation becomes unstable. On the other hand, if load capacitances 151 and 152 for a fixed potential (low supply voltage Vss) are connected to the output terminals OP and OM of the fully differential amplifier 102 in order to increase the phase margin of the common-mode feedback system, high-speed differential-mode operation of the circuit is hampered because the load capacitances 151 and 152 also function as the load capacitances for the differential mode.

Figure 2:
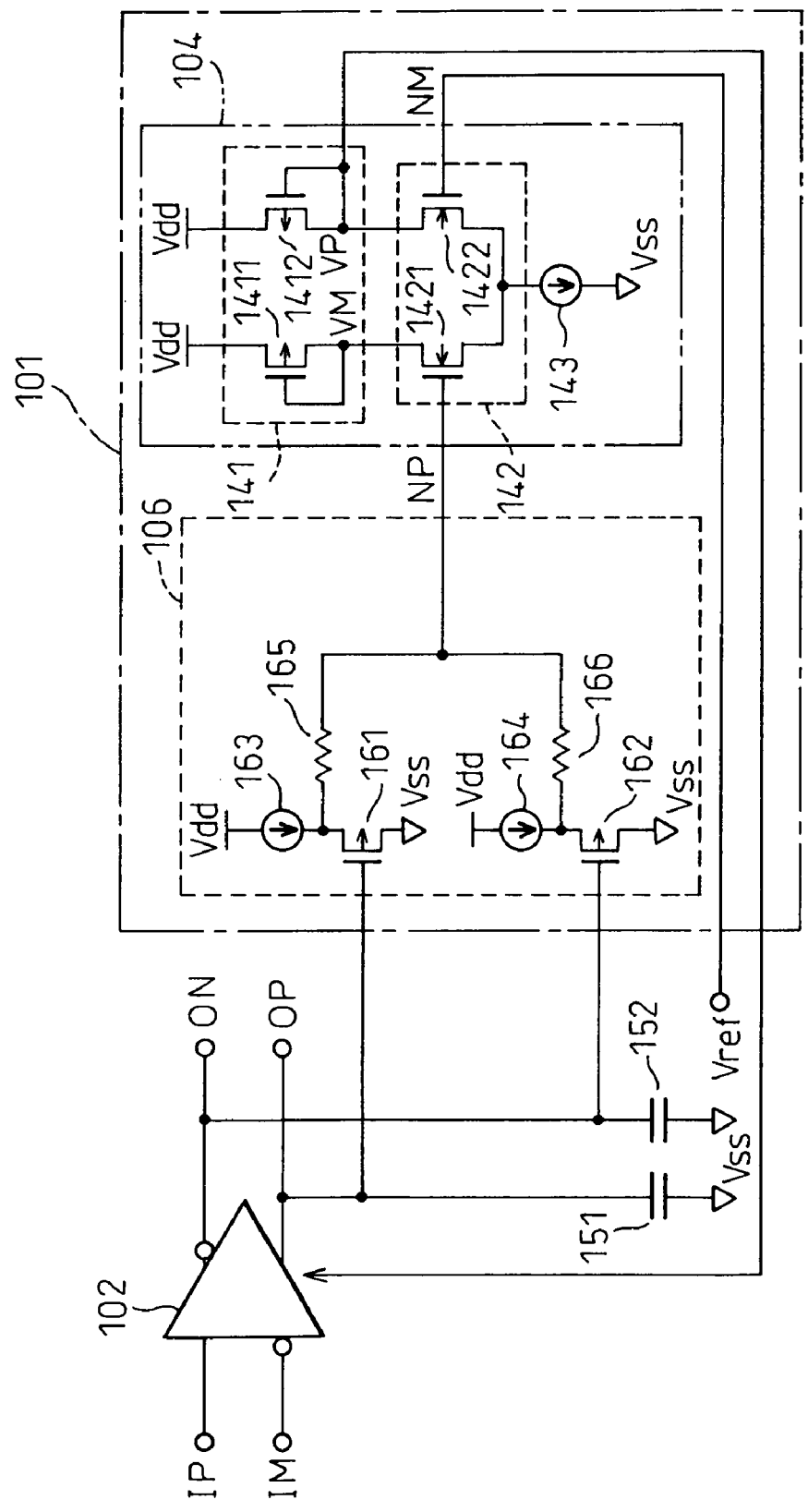
FIG. 2 is a circuit diagram showing another example of a prior art common-mode feedback circuit.

FIG. 2 is a circuit diagram showing another example of a prior art common-mode feedback circuit. In FIG. 2, reference numeral 106 indicates a buffer circuit.

In the prior art common-mode feedback circuit shown in FIG. 2, to achieve the high input impedance the output voltages of the fully differential amplifier 102 are first received by the buffer circuit 106, then the output of the buffer circuit 106 is used to construct the common-mode feedback circuit 101.

That is, as shown in FIG. 2, the buffer circuit 101 comprises: pMOS transistors 161 and 162 whose gates are coupled to the differential outputs (OP and OM) of the fully differential amplifier 102; constant current sources 163 and 164; and resistive elements 165 and 166. The transistors 161, 162 and their constant current sources 163, 164 are connected in series between high voltage supply line (Vdd) and low voltage supply line (Vss), and the connecting nodes between the transistors 161, 162 and the constant current sources 163, 164 are combined together via the respective resistive elements 165 and 166 and coupled to the gate (node NP) of the nMOS transistor 1421 in the differential pair 142. The gate (node NM) of the transistor 1422 in the differential pair 142 is supplied with the reference voltage Vref.

The prior art common-mode feedback circuit shown in FIG. 2 can achieve relatively fast operation while solving the problem of circuit stability, but there arises another problem, that is, power consumption increases because the buffer circuit 106 is used. Furthermore, the input voltage range of the common-mode feedback circuit 101 must be matched to the properly operating range of the buffer circuit 106. That is, since the output (OP, OM) voltage range of the fully differential amplifier 102 is limited to within the allowable input voltage range of the buffer circuit 106, the differential amplitude of the fully differential amplifier 102 must be limited accordingly, and this reduces the dynamic range of the circuit.

In a configuration where the output of the fully differential amplifier is directly input to the gate of the transistor in the common-mode feedback circuit, the output voltage range of the fully differential amplifier will have to be limited to within the allowable input voltage range of the common-mode feedback circuit, similarly to the prior art example FIG. 2 described above.

In view of this, there is a need to provide a common-mode feedback circuit that does not interfere with high-speed differential-mode operation and can ensure stability of a common-mode feedback system even when the resistance value of the impedance element used for voltage dividing is set large.

An object of the present invention to provide a common-mode feedback circuit (differential operational amplifier circuit) that has a wide input voltage range, is stable in operation, and has low power consumption.

Next, before proceeding to the detailed description of the embodiments of the common-mode feedback circuit and differential operational amplifier circuit according to the present invention, the basic functional configuration of the present invention will be described.

According to the present invention, there is provided a common-mode feedback circuit which outputs a control voltage for defining a common-mode operating point of a fully differential amplifier, comprising a voltage dividing circuit which divides a voltage across two output ends of the fully differential amplifier; and a differential amplifier which takes as inputs an output voltage of the voltage dividing circuit and a reference voltage, and wherein an output voltage of the differential amplifier is supplied as the control voltage to the fully differential amplifier.

According to the present invention, there is also provided a differential operational amplifier circuit comprising a fully differential amplifier; and a common-mode feedback circuit which outputs a control voltage for defining a common-mode operating point of the fully differential amplifier, wherein the common-mode feedback circuit comprises a voltage dividing circuit which divides a voltage across two output ends of the fully differential amplifier and a differential amplifier which takes as inputs an output voltage of the voltage dividing circuit and a reference voltage, and wherein an output voltage of the differential amplifier is supplied as the control voltage to the fully differential amplifier.

That is, the voltage across the two outputs (differential outputs) of the fully differential amplifier is divided through an impedance circuit, and a capacitive element is connected between a fixed potential and a midpoint of the impedance circuit. Then, the output current of the differential pair, which represents the difference between the reference voltage and the common-mode voltage appearing at the midpoint, is converted by the active load into a voltage which is supplied as the control voltage to the fully differential amplifier.

In this configuration, even when the resistance value of the impedance element used for voltage dividing is set large, high-speed differential-mode operation is not hampered, and stability of the common-mode feedback system can be ensured. At this time, the input voltage to the differential pair in the common-mode feedback circuit is the voltage to which the common-mode voltage detected by the voltage dividing circuit comprising the impedance element settles down by the action of the feedback, and the voltage is maintained substantially identical with the reference voltage. As a result, the differential pair can be operated properly, irrespective of the differential amplitude of the fully differential amplifier, and thus the input voltage range of the common-mode feedback circuit is not limited by the differential pair; accordingly, the output voltage range of the fully differential amplifier circuit can be set wide.

Further, by constructing the impedance circuit from a parallel circuit of a resistive element and a capacitive element, common-mode operation speed can be further increased, while ensuring the stability of the common-mode feedback system.

Furthermore, the impedance circuit is constructed to have a configuration equivalent to the voltage dividing circuit or to exhibit an impedance equivalent to that of the voltage dividing circuit; by inserting this impedance circuit between the differential amplifier and the input end of the reference voltage, robustness against power supply noise can be enhanced.

The embodiments of the common-mode feedback circuit (differential operational amplifier circuit) according to the present invention will be described in detail below with reference to the accompanying drawings.

[Embodiment 1]

Figure 3:
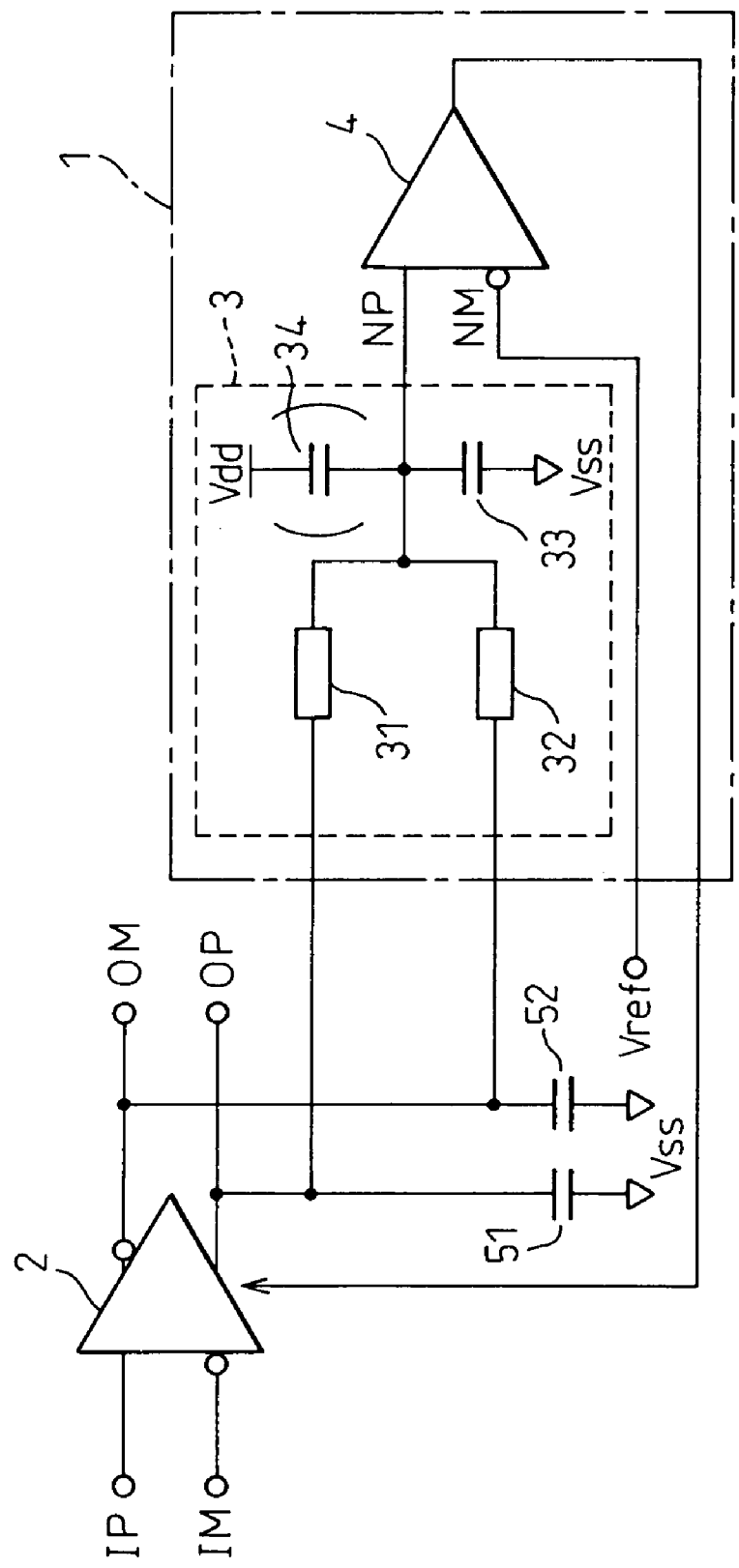
FIG. 3 is a circuit diagram showing in simplified form a first embodiment of a common-mode feedback circuit according to the present invention.

FIG. 3 is a circuit diagram showing a first embodiment of the common-mode feedback circuit according to the present invention. In FIG. 3, reference numeral 1 indicates the common-mode feedback circuit, 2 the fully differential amplifier, 3 the voltage dividing circuit, and 4 the differential amplifier.

As shown in FIG. 3, the common-mode feedback circuit 1 comprises the voltage dividing circuit 3 and the differential amplifier 4, and the voltage dividing circuit 3 comprises impedance elements 31 and 32 and a capacitive element 33 (34). The positive logic output OP of the fully differential amplifier 2 is supplied via the impedance element 31 to the positive logic input terminal NP of the differential amplifier 4, while the negative logic output OM of the fully differential amplifier 2 is supplied via the impedance element 32 to the positive logic input terminal NP of the differential amplifier 4. Reference numerals 51 and 52 are load capacitances which are driven by the fully differential amplifier circuit 2.

The capacitive element 33 is provided between the common connection node of the impedance elements 31 and 32 (the positive logic input terminal NP of the differential amplifier 4) and the low voltage supply line Vss. Here, another capacitive element 34 may be provided between the common connection node (NP) of the impedance elements 31 and 32 and the high voltage supply line Vdd. It is also possible to provide a capacitive element between the common connection node (NP) of the impedance elements 31 and 32 and an intermediate bias voltage supply line (the intermediate bias voltage is, for example, a voltage obtained by resistively dividing the supply voltage, or a bias voltage generated using a current source and a transistor). That is, one or more capacitive elements can be provided, each connected between the midpoint (NP) of the voltage dividing impedance circuits 31 and 32 and the fixed voltage Vss or Vdd or some other bias voltage.

[Embodiment 2]

Figure 4:
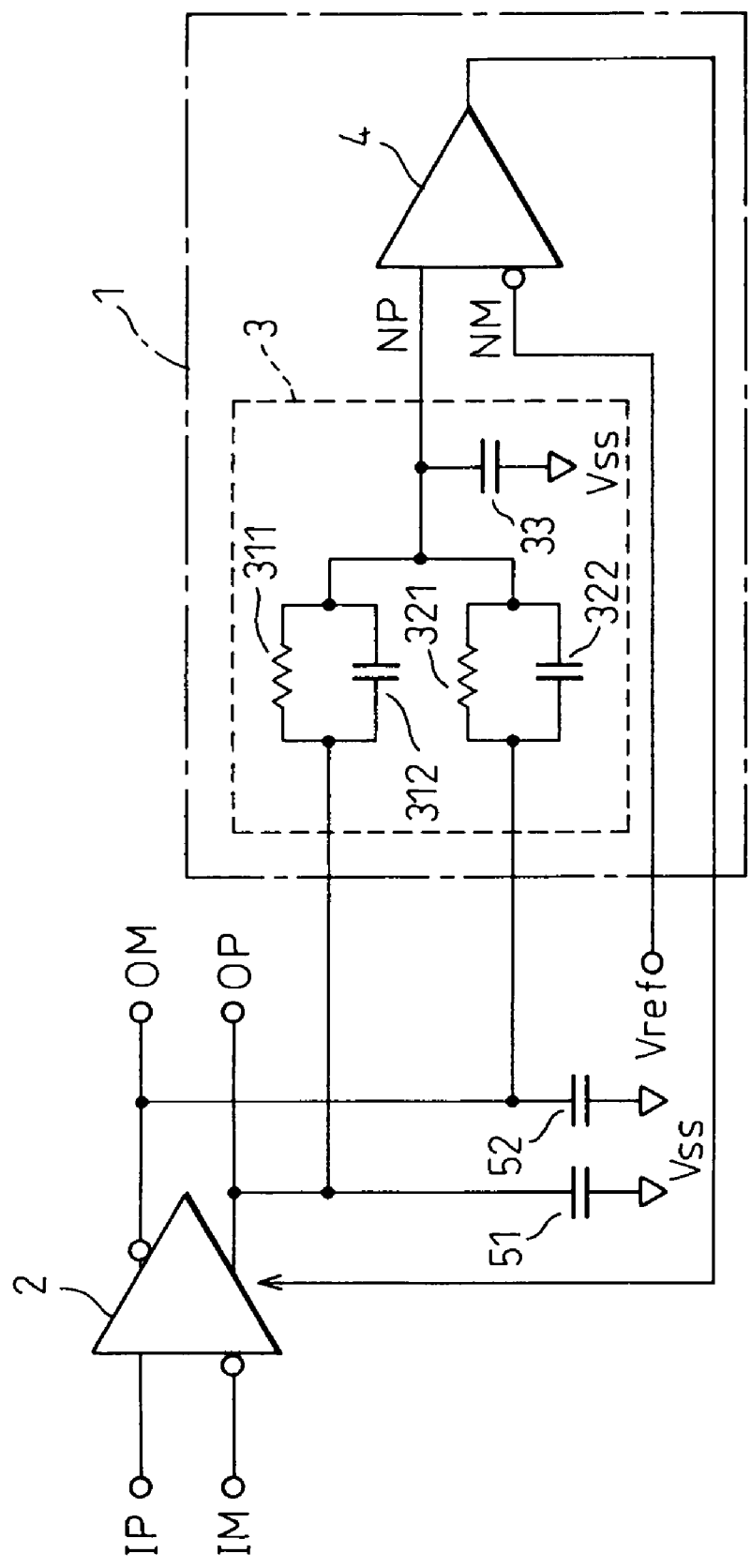
FIG. 4 is a circuit diagram showing in simplified form a second embodiment of a common-mode feedback circuit according to the present invention.

FIG. 4 is a circuit diagram showing in simplified form a second embodiment of the common-mode feedback circuit according to the present invention.

As is apparent from a comparison between FIG. 4 and FIG. 3, in the common-mode feedback circuit of the second embodiment, the impedance element 31 in the common-mode feedback circuit of the foregoing first embodiment is constructed from a parallel connection of a resistive element 311 and a capacitive element 312, and likewise, the impedance element 32 is constructed from a parallel connection of a resistive element 321 and a capacitive element 322.

[Embodiment 3]

Figure 5:
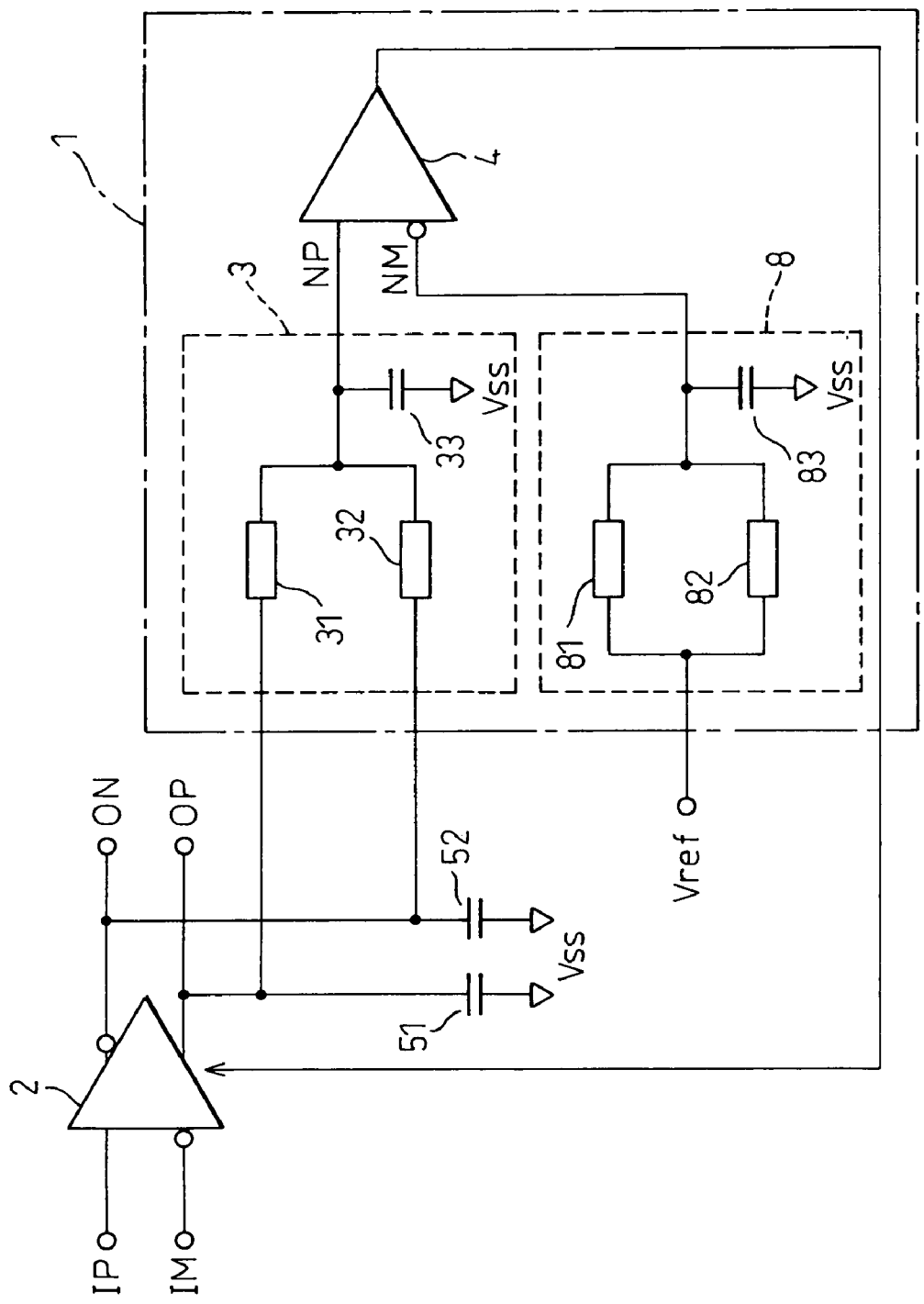
FIG. 5 is a circuit diagram showing in simplified form a third embodiment of a common-mode feedback circuit according to the present invention.

FIG. 5 is a circuit diagram showing in simplified form a third embodiment of the common-mode feedback circuit according to the present invention.

As is apparent from a comparison between FIG. 5 and FIG. 3, in the common-mode feedback circuit of the third embodiment, the reference voltage Vref is supplied to the negative logic input terminal NM of the differential amplifier 4 via an impedance circuit 8, rather than supplying it directly to the negative logic input terminal NM as in the common-mode feedback circuit of the first embodiment. Here, the impedance circuit 8 is identical in configuration to the voltage dividing circuit 3, and comprises impedance elements 81 and 82 and a capacitive element 83. The impedance elements 81 and 82 may be constructed as a single impedance element equivalent to the two impedance elements 81 and 82. When the voltage dividing circuit 3 is constructed by also providing a capacitive element (34) between the common connection node of the impedance elements 31 and 32 (the positive logic input terminal NP of the differential amplifier 4) and the high voltage supply line Vdd, it is preferable to maintain the symmetry by also providing a capacitive element in the impedance circuit 8 between the negative logic input terminal NM of the differential amplifier 4 and the high voltage supply line Vdd. Further, when, in the voltage dividing circuit 3, a capacitive element is provided between the positive logic input terminal NP of the differential amplifier 4 and an intermediate bias voltage supply line, for example, it is preferable to maintain the symmetry by also providing a capacitive element in the impedance circuit 8 between the negative logic input terminal NM of the differential amplifier 4 and the intermediate bias voltage supply line.

When similar circuits (the voltage dividing circuit 3 and the impedance circuit 8) are provided for the positive logic input terminal NP and negative logic input terminal NM of the differential amplifier 4 as described above, the frequency characteristics of the input impedances to the input terminals NP and NM of the differential amplifier 4 can be matched between them, which serves to enhance the symmetry of operation of the differential amplifier 4 and to increase the robustness of the circuit operation against high frequency power supply noise, etc.

[Embodiment 4]

Figure 6:
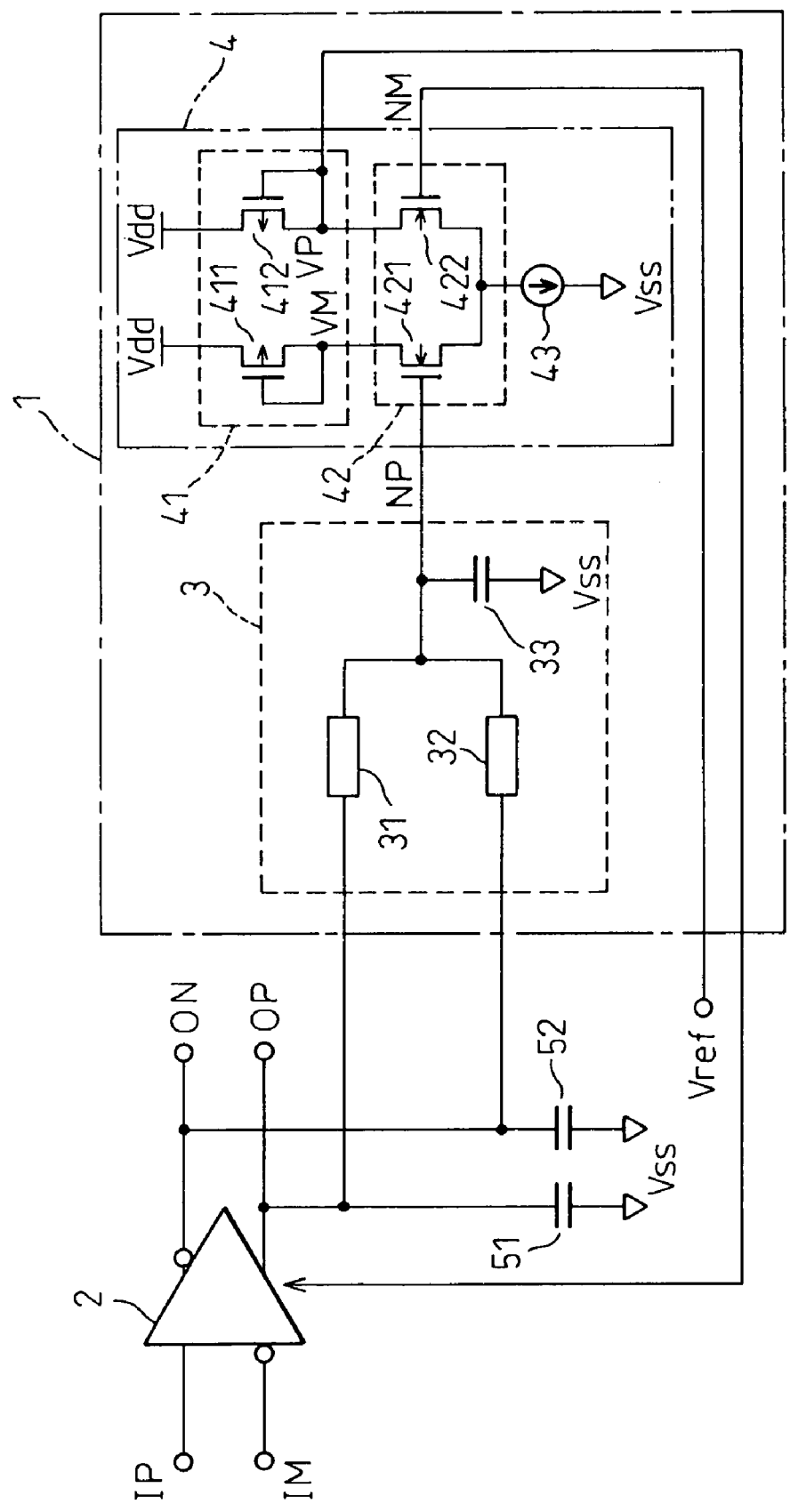
FIG. 6 is a circuit diagram showing in simplified form a fourth embodiment of a common-mode feedback circuit according to the present invention.

FIG. 6 is a circuit diagram showing in simplified form a fourth embodiment of the common-mode feedback circuit according to the present invention; here, the differential amplifier circuit 4 is shown in further detail.

As shown in FIG. 6, the differential amplifier circuit 4 comprises an active load 41 constructed from pMOS transistors 411 and 412 with their gates connected to their drains, a differential pair 42 consisting of nMOS transistors 421 and 422, and a current source 43.

[Embodiment 5]

Figure 7:
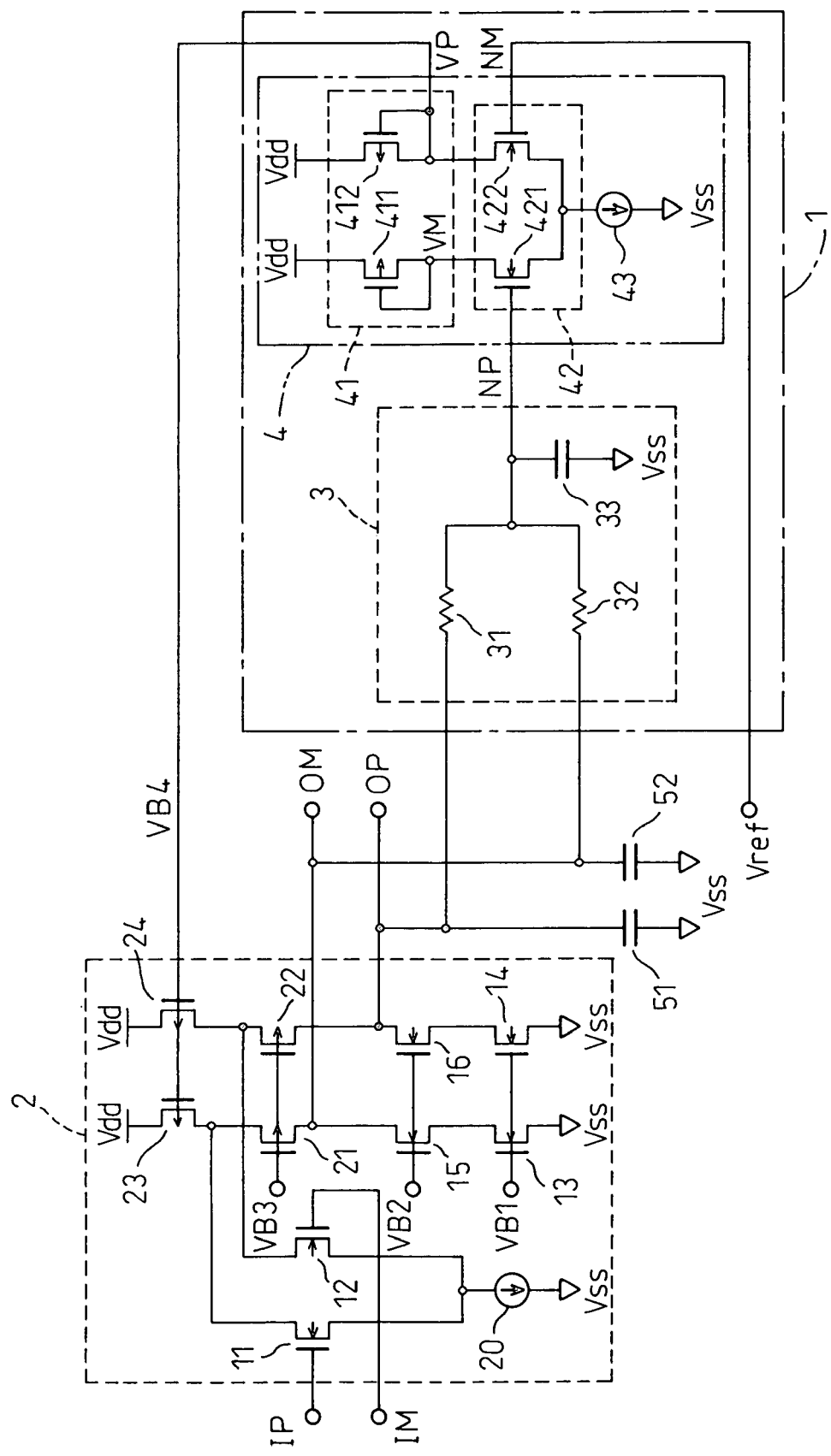
FIG. 7 is a circuit diagram showing a fifth embodiment of a common-mode feedback circuit according to the present invention.

FIG. 7 is a circuit diagram showing a fifth embodiment of the common-mode feedback circuit according to the present invention, in which the impedance elements 31 and 32 in the foregoing fourth embodiment shown in FIG. 6 are each constructed from a resistive element, and the fully differential amplifier circuit 2 is constructed as a cascode amplifier comprising PMOS transistors 21 to 24, nMOS transistors 11 to 16, and a current source 20. In the fifth embodiment, the terminal that controls the common-mode output voltage is the common gate terminal of the pMOS transistors 23 and 24, and the output voltage of the differential amplifier circuit 4 is fed back as a bias voltage VB4 to the transistors 23 and 24. Reference numerals 51 and 52 are load capacitances which are driven by the fully differential amplifier 2.

The operation of the common-mode feedback circuit of the fifth embodiment will be described below.

The differential output terminals OP and OM of the fully differential amplifier 2 are coupled to the common-mode feedback circuit 1, and the common-mode voltage is detected by dividing the voltage across the two output terminals OP and OM of the fully differential amplifier 2 by the voltage dividing circuit 3. The thus detected common-mode voltage of the fully differential amplifier 2 and the reference voltage Vref are input to the differential amplifier circuit 4, and the output voltage VP (bias voltage VB4) is fed back to the fully differential amplifier 2. More specifically, the output of the voltage dividing circuit 3 is supplied to the gate of the transistor 421 in the differential pair 42, the reference voltage Vref is supplied to the gate of the transistor 422 in the differential pair 42, the output current of the differential pair 42 is converted into a voltage by the active load 41 (transistors 411 and 412), and the voltage at node VP is fed back as the control voltage (the bias voltage VB4 to the transistors 23 and 24) to the fully differential amplifier 2. Then, the currents flowing through the transistors 23 and 24 are both controlled simultaneously by the control voltage (VB4), and the common-mode output voltage of the fully differential amplifier 2 is thus controlled. That is, the common-mode feedback system in the circuit forms a negative feedback circuit, and the feedback is applied so that the common-mode voltage of the fully differential amplifier 2 becomes identical with the reference voltage Vref input to the common-mode feedback circuit 1.

Figure 8:
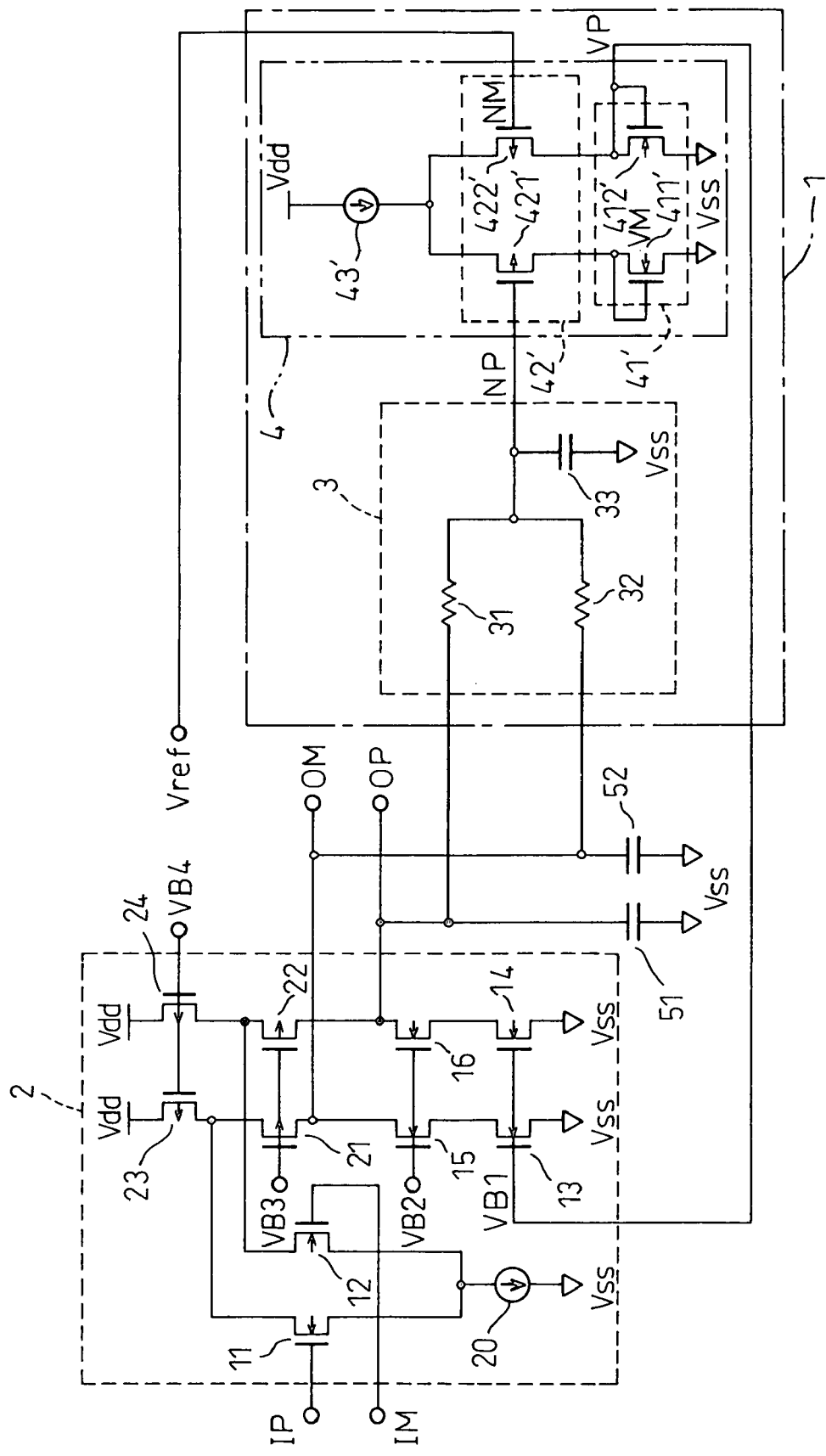
FIG. 8 is a circuit diagram showing a modified example of the common-mode feedback circuit of FIG. 7.

FIG. 8 is a circuit diagram showing a modified example of the common-mode feedback circuit of FIG. 7.

As is apparent from a comparison between FIG. 8 and FIG. 7, in the modified example shown here, the differential pair 42 comprising the nMOS transistors 421 and 422 in the differential amplifier circuit 4 of the above-described fifth embodiment is replaced by a differential pair 42' comprising PMOS transistors 421' and 422', and the active load 41 comprising the PMOS transistors 411 and 412 is replaced by an active load 41, comprising nMOS transistors 411' and 412', while the current source 43 provided between the differential pair 42 and the low voltage supply line Vss is removed, and instead, a current source 43' is provided between the differential pair 42' and the high voltage supply line Vdd. The output voltage (VP) of the differential amplifier circuit 4 is fed back as a bias voltage VB1 to the transistors 13 and 14 in the fully differential amplifier circuit 2.

[Embodiment 6]

Figure 9:
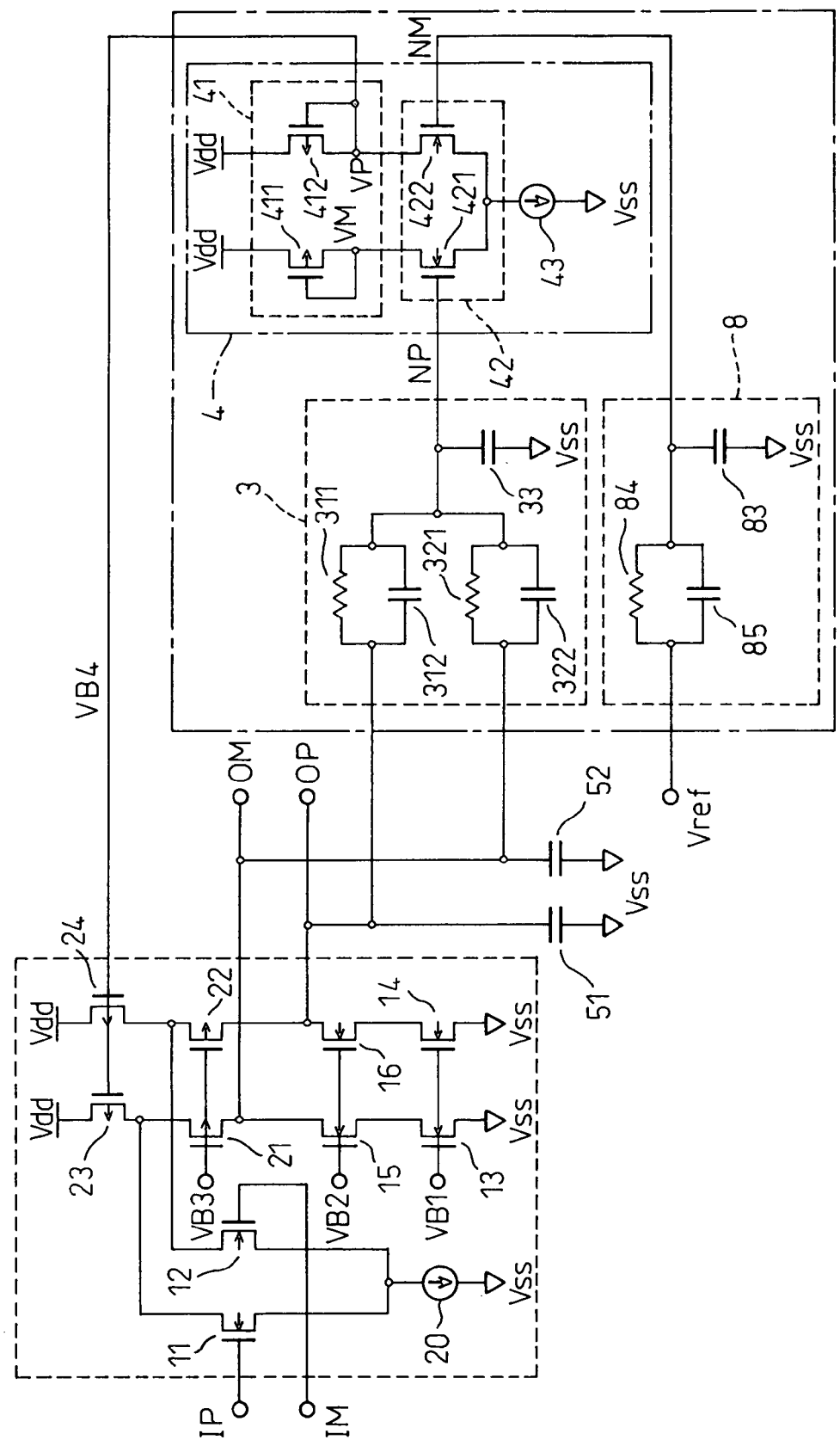
FIG. 9 is a circuit diagram showing a sixth embodiment of a common-mode feedback circuit according to the present invention.

FIG. 9 is a circuit diagram showing a sixth embodiment of the common-mode feedback circuit according to the present invention.

As is apparent from a comparison between FIG. 9 and FIG. 7, the common-mode feedback circuit of the sixth embodiment differs from that of the fifth embodiment in that the resistive elements 31 and 32 in the voltage dividing circuit 3 is replaced by resistive elements 311 and 312 and their associated capacitive elements 312 and 322, and in that the reference voltage Vref is supplied to the negative logic input terminal NM of the differential amplifier circuit 4 via an impedance circuit 8.

That is, when the capacitive elements 312 and 322 are added to the resistive elements 31 (311) and 32 (321) in the voltage dividing circuit 3 of the fifth embodiment of FIG. 7, a greater phase margin can be provided because, in the common-mode feedback system, the voltage dividing circuit 3 creates a first zero. Further, when compared with the fifth embodiment, in the sixth embodiment the capacitance value of the capacitive element 33 necessary to obtain a prescribed phase margin can be reduced, and thus the common-mode operation can be made faster.

Furthermore, the provision of the capacitive elements 312 and 322 in the voltage dividing circuit 3 does not much affect the differential-mode operation speed of the fully differential amplifier 2 because, in many cases, the intended effect can be obtained even if their capacitive values are made as small as about one-tenth of the capacitive value of the capacitive element 33.

The negative logic input terminal NM of the differential amplifier circuit 4 is supplied with the reference voltage Vref via the impedance circuit 8. Here, let R1 and R2 denote the resistance values of the resistive elements 311 and 321 in the voltage dividing circuit 3, and R3 denote the resistance value of the resistive element 84 in the impedance circuit 8. Further, let C1, C2, and C denote the capacitance values of the capacitive elements 312, 322, and 33 in the voltage dividing circuit 3, and C3 and CP denote the capacitance values of the capacitive elements 85 and 83 in the impedance circuit 8; then, when the values are set such that R3=R1/2 (=R2/2), C3=C1×2 (=C2×2), and CM=CP, the impedance that the impedance circuit 8 exhibits can be made equal to the common-mode impedance of the voltage dividing circuit 3.

By adding the impedance circuit 8 as described above, the frequency characteristics of the input impedances to the two input terminals NP and NM of the differential pair 42 can be further matched between them, which serves to enhance the symmetry of operation of the differential amplifier 4 and to increase the robustness of the circuit operation against high frequency power supply noise, etc.

Figure 10A:
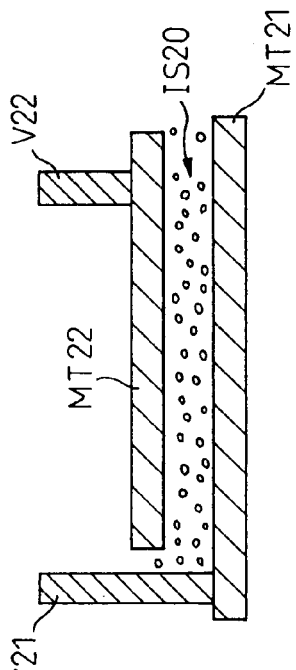
FIGS. 10A, 10B, 10C, and 10D are diagrams schematically showing structure examples of the capacitive elements used in the common-mode feedback circuit according to the present invention.
Figure 10B:
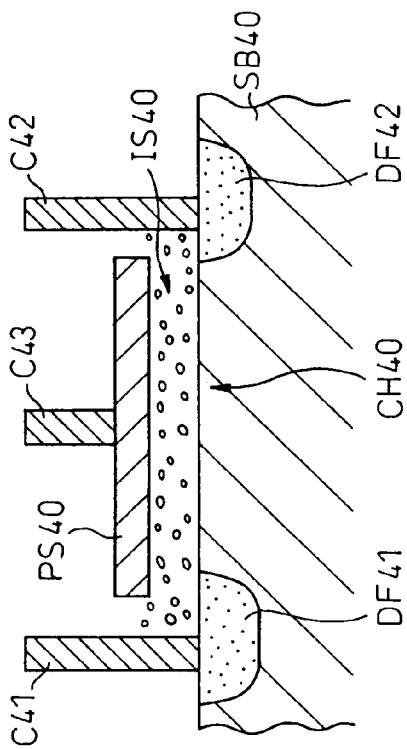
Figure 10C:
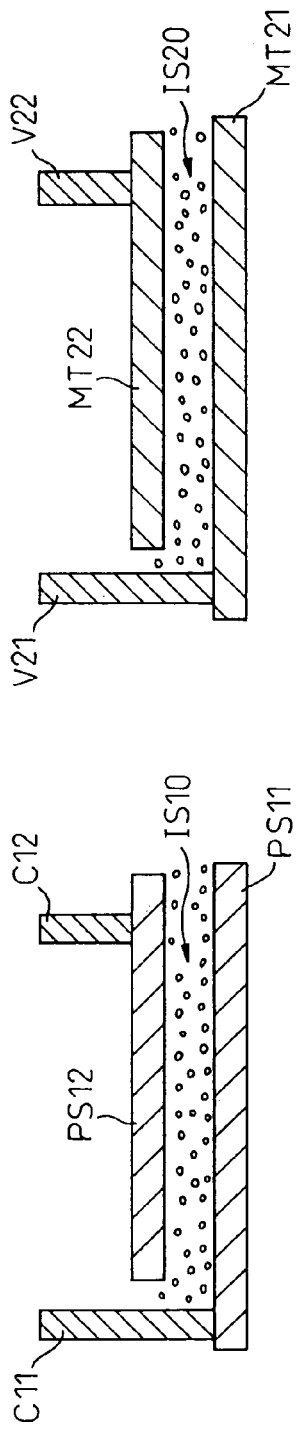
Figure 10D:
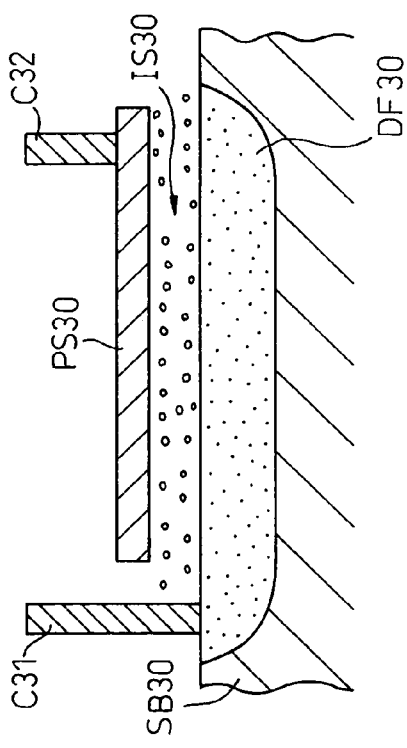

FIGS. 10A to 10D are diagrams schematically showing structure examples of the capacitive elements used in the common-mode feedback circuit according to the present invention: FIG. 10A shows a double polysilicon capacitor, FIG. 10B shows a MIM (Metal Insulation Metal) capacitor, FIG. 10C shows a polysilicon-diffusion layer capacitor, and FIG. 10D shows a MOS (Metal Oxide Silicon) capacitor.

The various structures shown in FIGS. 10A to 10D can be employed for the capacitive elements (for example, the capacitive elements 33, 34, 312, 322, 83, and 85) used in the common-mode feedback circuit of the present invention. That is, the capacitive elements can be constructed by employing the double polysilicon capacitor structure shown in FIG. 10A, the MIM capacitor structure shown in FIG. 10B, the polysilicon-diffusion layer capacitor structure shown in FIG. 10C, or the MOS capacitor structure shown in FIG. 10D. Here, reference characters V21 and V22 indicate vias, C11, C12, C31, C32, C41, and C42 indicate contacts, DF30, DF41, and DF42 indicate diffusion layers, IS10, IS20, IS30, and IS40 indicate insulating layers, MT21 and MT22 indicate metal layers, PS11, PS12, PS30, and PS40 indicate polysilicon layers, and SB30 and SB40 indicate substrates.

As shown in FIG. 10A, the double polysilicon capacitor comprises the polysilicon layer PS11 connected to the contact C11, the polysilicon layer PS12 connected to the contact C12, and the insulating layer IS10 sandwiched between the polysilicon layers PS11 and PS12. Likewise, as shown in FIG. 10B, the MIM capacitor comprises the metal layer MT21 connected to the via V21, the metal layer MT22 connected to the via V22, and the insulating layer IS20 sandwiched between the metal layers MT21 and MT22.

Further, as shown in FIG. 10C, the polysilicon-diffusion layer capacitor comprises the diffusion layer DF30 formed in the substrate SB30 and connected to the contact C31, the polysilicon layer PS30 connected to the contact C32, and the insulating layer IS30 sandwiched between the diffusion layer DF30 and the polysilicon layer PS30. Also, as shown in FIG. 10D, the MOS capacitor comprises the diffusion layers DF41 and DF42 (source region and drain region) formed in the substrate SB40 and connected to the respective contacts C41 and C42, a substrate region (channel region) CH40 between the diffusion layers DF41 and DF42, the polysilicon layer (gate) PS40 connected to the contact C43, and the insulating layer IS40 sandwiched between the channel region CH40 and the polysilicon layer PS40.

It will be appreciated that the capacitive elements are not limited to any one of the capacitor structures described with reference to FIGS. 10A to 10D, but various other structures can be employed.

The embodiments described above are merely examples of the present invention, and the common-mode feedback circuit of the present invention can be adapted to accommodate various modifications. For example, when the channel conductivity type of the transistors for controlling the common-mode output voltage of the fully differential amplifier 2 is different from that shown in any particular embodiment, that is, for example, when the terminal for controlling the common-mode output voltage is the common gate terminal of the nMOS transistors 13 and 14 as in the modified example shown in FIG. 8, not the common gate terminal of the pMOS transistors 23 and 24 as in the fifth embodiment shown in FIG. 7, the differential amplifier 4 in the common-mode feedback circuit 1 can be constructed from a complementary circuit by inverting the conductivity type of its constituent transistors to adapt for such modification. Further, in cases where the sign of the transfer function of the common-mode output voltage produced in response to the control voltage is inverted from that shown in any particular embodiment described above, the common-mode feedback circuit 1 can be configured to supply the voltage at the output node VM, not the output node VP, as the control voltage to adapt for such modification without changing the essential configuration of the circuit.

Figure 11:
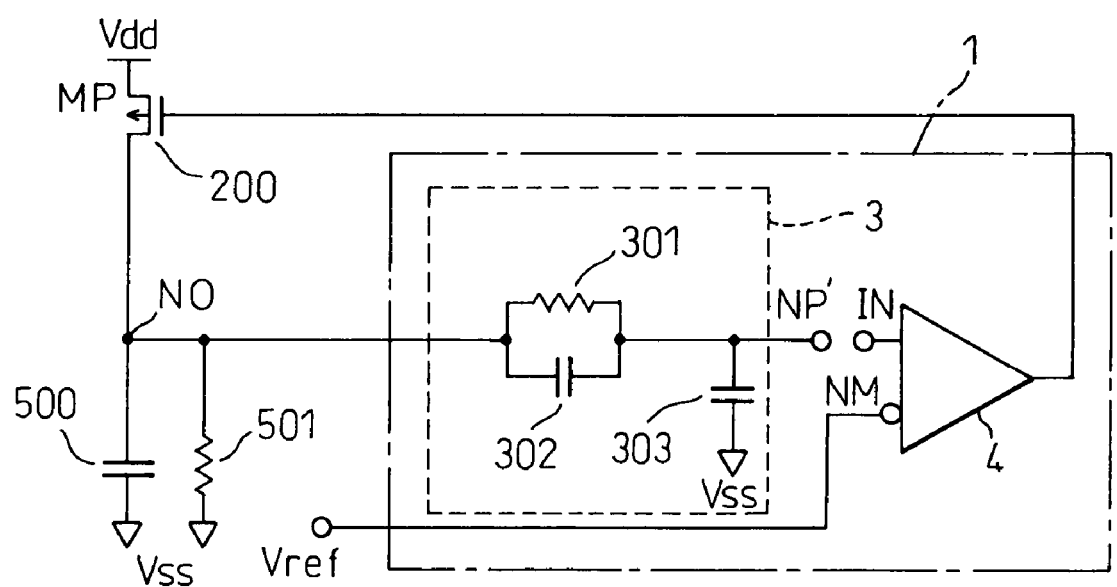
FIG. 11 is a diagram showing a simulation system used to obtain a loop transfer function.
Figure 12A:
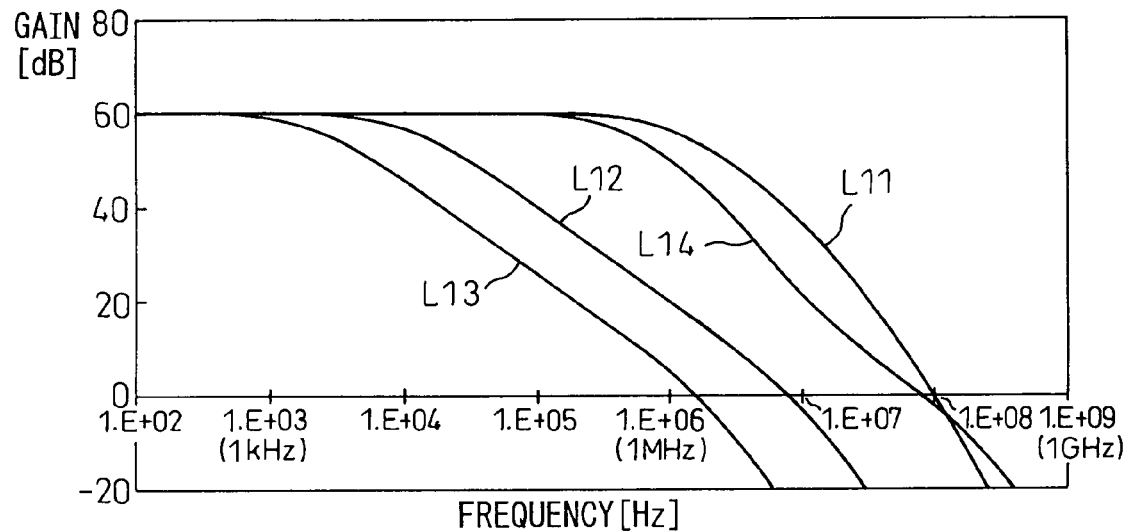
FIGS. 12A and 12B are Bode plots showing the frequency characteristics of the loop transfer function obtained by the simulation system of FIG. 11.
Figure 12B:
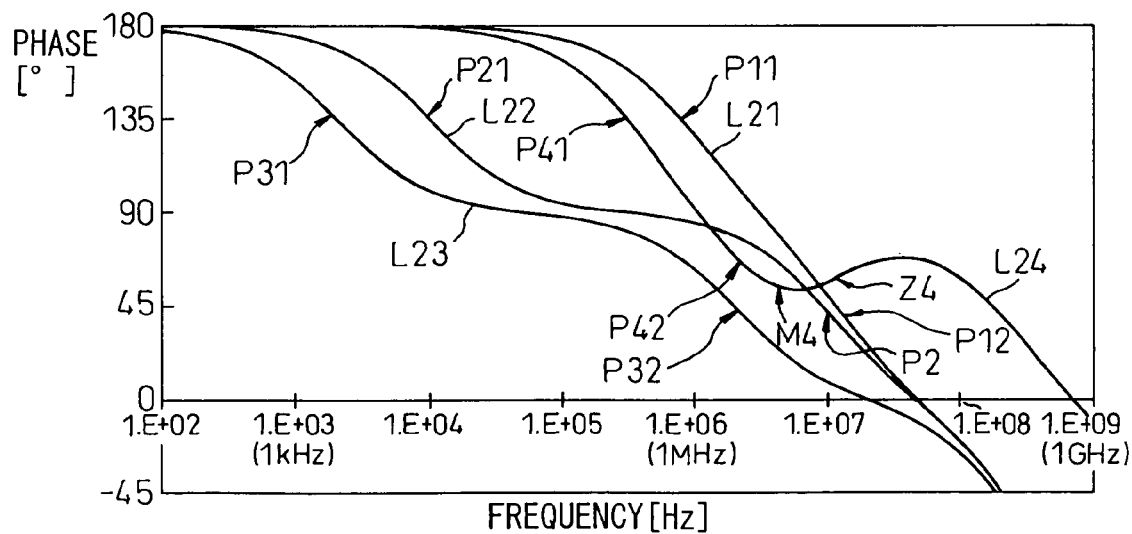

FIG. 11 is a diagram showing a simulation system used to obtain the loop transfer function, and presented to illustrate the frequency characteristics of the common-mode feedback circuit of the fifth embodiment shown in FIG. 7. FIGS. 12A and 12B are Bode plots showing the frequency characteristics of the loop transfer function obtained by the simulation system of FIG. 11.

FIG. 11 shows the system for simulating the loop transfer function of the common mode by simplifying the configuration of the circuit of FIG. 1, which shows one example of the prior art common-mode feedback circuit, the circuit of FIG. 7, which shows the common-mode feedback circuit of the fifth embodiment according to the present invention, and the circuit of FIG. 9, which shows the common-mode feedback circuit of the sixth embodiment according to the present invention; here, to obtain the transfer function through the loop, the node of the negative logic input terminal NP of the differential amplifier circuit 4, 104 was divided into two nodes NP' and IN, and the response of the node NP was simulated when the node IN was the input. The obtained loop transfer function is plotted in the form of a Bode plot as shown in FIGS. 12A and 12B.

In FIG. 12A, gain is plotted as a function of frequency, while in FIG. 12B, phase is plotted as a function of frequency. In FIGS. 12A and 12B, curves L11 and L21 show the characteristics when the output load capacitance is small in the common-mode feedback circuit of FIG. 1, while curves L12 and L22 show the characteristics when the output load capacitance is large in the common-mode feedback circuit of FIG. 1. Further, in FIGS. 12A and 12B, curves L13 and L23 show the characteristics of the common-mode feedback circuit of the fifth embodiment shown in FIG. 7, while curves L14 and L24 show the characteristics of the common-mode feedback circuit of the sixth embodiment shown in FIG. 9.

In FIG. 11, a pMOS transistor 200 corresponds, for example, to the pMOS transistor 23 (24) in the fully differential amplifier circuit 2 of FIG. 7, a capacitive element 500 corresponds to the capacitive element 51, 52, and a resistive element 301 and a capacitive element 302 correspond, for example, to the resistive element 31, 32 in the voltage dividing circuit 3 in the common-mode feedback circuit of FIG. 7. Here, let CL denote the capacitance value of the capacitive element (load capacitance) 500, RL denote the resistance value of a resistive element (output resistor) 501, R10 denote the resistance value of the resistive element 301, C10 denote the capacitance value of the capacitive element 302, and CP denote the capacitance value of a capacitive element 303 (which, in the circuit of FIG. 7, corresponds to the capacitive element 33 and the parasitic capacitance at the node NP in the voltage dividing circuit 3 and, in the circuit of FIG. 1, corresponds to the parasitic capacitance at the node NP). For comparison purposes, in the circuit of FIG. 1, for example, the capacitance values of the load capacitances 151 and 152 are denoted by CLP and CLM, respectively, and the resistance values of the resistive elements 131 and 132 are denoted by R1 and R2, respectively.

In the simulation system of FIG. 11, the capacitance value (output load capacitance) CL of the load capacitance 500 was set as CL=1 pF (where CL=CLP+CLM), and the resistance value RL of the output resistor 501 was set as RL=½π [MΩ] (which corresponds, for example, to the combined output resistance of the differential outputs OP and OM in the fully differential amplifier circuit 102 of FIG. 1). Accordingly, the resistance value R10 of the resistive element 301 (the combined resistance of the resistance values R1 and R2 of the resistive elements 131 and 132 in FIG. 1), for example, is given as R10=½π [MΩ].

Then, by setting CL=1 pF, C10=0 pF, and CP=0.1 pF in the prior art common-mode feedback circuit shown in FIG. 1, simulation was performed first for the case where the output load capacitance was small, and the curves L11 and L21 were obtained. Here, the capacitance value CP=0.1 pF corresponds to the parasitic capacitance of the node NP (NP'). The DC gain of the common-mode loop was 60 dB.

According to the results of the simulation performed for the case where the output load capacitance was small in the prior art common-mode feedback circuit 101 of FIG. 1, the phase-frequency characteristic shown by the curve L21 in FIG. 12B was obtained, that is, a first pole P11 attributable to the node NO of the circuit shown in FIG. 11 is located at about 1 MHz, and a second pole P12 attributable to the node NP is located at about 10 MHz. Further, as shown by the curve L11 in FIG. 12A and the curve L21 in FIG. 12B, the phase is already negative at the frequency (about 100 MHz) at which the gain is 0 dB, which shows that there is no phase margin and the circuit is unstable.

Next, the curves L12 and L22 were obtained by performing simulation for the case where the output load capacitance was large in the prior art common-mode feedback circuit 101 of FIG. 1, that is, for the case where the output load capacitance was increased (CL=100 pF) to make the system stable by providing a phase margin of about 50 degrees (the necessary phase margin varies according to the configuration and purpose of the circuit but, as an example, a phase margin of 50 degrees was considered here).

According to the results of the simulation performed for the case where the output load capacitance was large in the prior art common-mode feedback circuit 101 of FIG. 1, the phase is about 50 degrees at the frequency (slightly lower than 10 MHz) at which the gain is 0 dB, as shown by the curve L12 in FIG. 12A and the curve L22 in FIG. 12B, and thus it can be seen that a sufficient phase margin is obtained. That is, in this condition, as shown in the curve L22 in FIG. 12B, the first pole P21 attributable to the node NO is shifted to the position of about 10 kHz, i.e., the position shifted far away in the low frequency direction from the second pole P22 attributable to the node NP; this offers the effect of being able to sufficiently lower the gain before the phase of the system rotates through 180 degrees.

However, when the output load capacitance is increased by setting CL=100 pF, high-speed differential-mode operation of the circuit is hampered because, as previously described, the output load capacitance also functions as the output load for the differential mode.

Next, in the simulation for the common-mode feedback circuit of the fifth embodiment according to the present invention, the output load capacitance CL was set back as CL=1 pF, and the capacitance value CP of the capacitive element 33 in the voltage dividing circuit 3 was set as CP=250 pF, and the curves L13 and L23 were obtained.

According to the results of the simulation performed for the common-mode feedback circuit of the fifth embodiment according to the present invention of FIG. 7, it can be seen that, as shown by the curve L13 in FIG. 12A and the curve L23 in FIG. 12B, a phase margin of about 50 degrees is obtained at the frequency (slightly higher than 1 MHz) at which the gain is 0 dB. At this time, the first pole P31 attributable to the node NP is shifted to the position slightly higher than 1 kHz, i.e., the position shifted far away in the low frequency direction from the second pole P32 attributable to the node NO; this offers the effect of being able to sufficiently lower the gain before the phase of the system rotates through 180 degrees.

Finally, in the simulation for the common-mode feedback circuit of the sixth embodiment according to the present invention, the load capacitance CL was set as CL=1 pF, the capacitance C10 in the voltage dividing circuit 3 was set as C10=C1+C2 (that is, the sum of the capacitance values C1 and C2 of the capacitive elements 312 and 322 in the voltage dividing circuit 3 in FIG. 9), and the capacitance value CP of the capacitive element 33 in the voltage dividing circuit 3 was set as CP=250 pF, and the curves L13 and L23 were obtained.

According to the results of the simulation performed for the common-mode feedback circuit of the sixth embodiment according to the present invention of FIG. 9, the minimum value (M4) of the phase is about 50 degrees at a frequency slightly lower than 10 MHz in the frequency region lower than the frequency (slightly lower than 100 MHz) at which the gain is 0 dB, as shown by the curve L14 in FIG. 12A and the curve L24 in FIG. 12B, and thus it can be seen that this much phase margin is obtained.

Further, in the sixth embodiment shown in FIG. 9, the gain extends into a higher frequency region compared with the fifth embodiment shown in FIG. 7 or even with the case of the prior art common-mode feedback circuit of FIG. 1 when the output load capacitance is increased; this shows that faster common-mode operation is possible. Here, two dominant poles, the pole P41 attributable to the node NP and the pole P42 attributable to the node NO, are located at about 400 kHz and 2 MHz, respectively, and a zero Z4 attributable to the resistive element 301 and capacitive element 302 is located at about 10 MHz; that is, the effect of recovering the phase is obtained here. The phase again decreases in the higher frequency region because of the effects of higher frequency poles in the system such as poles within the differential amplifier circuit 4.

Next, the stability of the common-mode feedback system in the common-mode feedback circuit of the present invention will be considered in conjunction with the loop transfer function of the feedback system.

For example, in the fifth embodiment shown in FIG. 7, when the resistance values R1 and R2 of the resistive elements 31 and 32 in the voltage dividing circuit 3 are relatively small compared with the output resistance (Ro) of the fully differential amplifier 2, the pole attributable to the output end of the fully differential amplifier 2 is the dominant cause for the first pole of the loop transfer function, and the second and subsequent poles are located in a relatively high frequency region; as a result, the phase margin is large and the circuit is stable.

However, if the resistance values R1 and R2 are set large in order to increase the input impedance of the common-mode feedback circuit, the frequency of the pole attributable to one of the inputs of the differential pair 42, i.e., the node NP, becomes lower and, in the frequency region, the separation between the first pole and the second pole decreases, degrading the stability of the common-mode feedback system in the circuit.

Therefore, in each embodiment of the common-mode feedback circuit according to the present invention, by adding the capacitive element 33 (34) in the voltage dividing circuit 3 the pole attributable to the node NP is shifted to the lower frequency so that the pole attributable to the terminal NP becomes the dominant cause for the first pole of the loop transfer function. This serves to stabilize the common-mode feedback system.

Here, the added capacitive element 33 (34) does not become a load capacitance for the differential mode, because it is connected to the midpoint (node NP) of the voltage dividing circuit 3 which divides the output voltage of the fully differential amplifier 2. Therefore, this capacitive element 33 (34) does not interfere with the differential-mode operation speed of the fully differential amplifier 2.

Further, in each embodiment of the common-mode feedback circuit according to the present invention, the fluctuation of the input voltage to the differential pair 42 is extremely small because the voltage at one input terminal (node NP) of the differential pair is at all times held close to the reference voltage Vref of the other input terminal (node NM) by the action of the common-mode negative feedback circuit. As a result, the differential pair 42 can be operated properly, irrespective of the differential amplitude of the fully differential amplifier 2, and thus the input voltage range of the common-mode feedback circuit 1 is not limited by it.

As described in detail above, according to the present invention, a common-mode feedback circuit (differential operational amplifier circuit) can be provided that has a wide input voltage range, is stable in operation, and has low power consumption.

The present invention can be applied to a common-mode feedback circuit which outputs a control voltage for defining the common-mode operating point of a fully differential amplifier, and of which a high input impedance is required. In this common-mode feedback circuit, even when the resistance value of the impedance element used for voltage dividing is set large, high-speed differential-mode operation is not hampered, and the stability of the common-mode feedback system can be ensured.

Many different embodiments of the present invention may be constructed without departing from the spirit and scope of the present invention, and it should be understood that the present invention is not limited to the specific embodiments described in this specification, except as defined in the appended claims.

What is claimed is:

1. A common-mode feedback circuit outputting a control voltage to define a common-mode operating point of a fully differential amplifier, comprising:
   a voltage dividing circuit dividing a voltage across two output ends of said fully differential amplifier; and
   a differential amplifier receiving an output voltage of said voltage dividing circuit and a reference voltage, wherein:
   an output voltage of said differential amplifier is amplified or attenuated with an arbitrary sign and supplied as the control voltage to said fully differential amplifier, and
   wherein the sign of an amplification factor of said differential amplifier is chosen so that a common-mode feedback system in said common-mode feedback circuit becomes a negative feedback system, based on a transfer function of an output common-mode voltage produced in response to said control voltage supplied to said fully differential amplifier.

2. A common-mode feedback circuit outputting a control voltage to define a common-mode operating point of a fully differential amplifier, comprising:
   a voltage dividing circuit dividing a voltage across two output ends of said fully differential amplifier; and
   a differential amplifier receiving an output voltage of said voltage dividing circuit and a reference voltage, wherein
   an output voltage of said differential amplifier is supplied as the control voltage to said fully differential amplifier, and
   wherein said voltage dividing circuit comprises:
   two impedance circuits dividing the voltage across said two output ends of said fully differential amplifier; and
   one or more capacitive elements each connected between a fixed potential and a midpoint at which the voltage is divided by said impedance circuits.

3. The common-mode feedback circuit as claimed in claim 2, wherein said voltage dividing circuit further comprises a capacitive element connected between a low voltage supply line and the midpoint at which the voltage is divided by said impedance circuits.

4. The common-mode feedback circuit as claimed in claim 2, wherein said voltage dividing circuit further comprises a capacitive element connected between a high voltage supply line and the midpoint at which the voltage is divided by said impedance circuits.

5. The common-mode feedback circuit as claimed in claim 2, wherein each of said impedance circuits comprises a resistive element and a capacitive element connected in parallel.

6. The common-mode feedback circuit as claimed in claim 2, wherein said impedance circuit has a configuration equivalent to said voltage dividing circuit, and is inserted between said differential amplifier and an input end of the reference voltage.

7. The common-mode feedback circuit as claimed in claim 2, wherein said impedance circuit is configured to exhibit an impedance equivalent to the impedance of said voltage dividing circuit, and is inserted between said differential amplifier and an input end of the reference voltage.

8. The common-mode feedback circuit as claimed in claim 2, wherein a first pole in a common-mode loop transfer function is dominantly caused by a pole attributable to said impedance circuits and said capacitive element in said voltage dividing circuit.

9. The common-mode feedback circuit as claimed in claim 2, wherein a first zero in a common-mode loop transfer function is dominantly caused by a zero attributable to said voltage dividing circuit, and is located in the vicinity of or on a low frequency side of a unity gain frequency.

10. A differential operational amplifier circuit comprising a fully differential amplifier, and a common-mode feedback circuit outputting a control voltage to define a common-mode operating point of said fully differential amplifier, wherein said common-mode feedback circuit comprises:
   a voltage dividing circuit dividing a voltage across two output ends of said fully differential amplifier; and
   a differential amplifier receiving an output voltage of said voltage dividing circuit and a reference voltage, wherein:
   an output voltage of said differential amplifier is amplified or attenuated with an arbitrary sign and supplied as the control voltage to said fully differential amplifier; and
   wherein the sign of an amplification factor of said differential amplifier is chosen so that a common-mode feedback system in said common-mode feedback circuit becomes a negative feedback system, based on a transfer function of an output common-mode voltage produced in response to said control voltage supplied to said fully differential amplifier.

11. A differential operational amplifier circuit comprising a fully differential amplifier, and a common-mode feedback circuit outputting a control voltage to define a common-mode operating point of said fully differential amplifier, wherein said common-mode feedback circuit comprises:
   a voltage dividing circuit dividing a voltage across two output ends of said fully differential amplifier; and
   a differential amplifier receiving an output voltage of said voltage dividing circuit and a reference voltage, wherein:
   an output voltage of said differential amplifier is supplied as the control voltage to said fully differential amplifier and wherein said voltage dividing circuit comprises:
   two impedance circuits dividing the voltage across said two output ends of said fully differential amplifier; and
   one or more capacitive elements each connected between a fixed potential and a midpoint at which the voltage is divided by said impedance circuits.

12. The differential operational amplifier circuit as claimed in claim 11, wherein said voltage dividing circuit further comprises a capacitive element connected between a low voltage supply line and the midpoint at which the voltage is divided by said impedance circuits.

13. The differential operational amplifier circuit as claimed in claim 11, wherein said voltage dividing circuit further comprises a capacitive element connected between a high voltage supply line and the midpoint at which the voltage is divided by said impedance circuits.

14. The differential operational amplifier circuit as claimed in claim 11, wherein each of said impedance circuits comprises a resistive element and a capacitive element connected in parallel.

15. The differential operational amplifier circuit as claimed in claim 11, wherein said impedance circuit has a configuration equivalent to said voltage dividing circuit, and is inserted between said differential amplifier and an input end of the reference voltage.

16. The differential operational amplifier circuit as claimed in claim 11, wherein said impedance circuit is configured to exhibit an impedance equivalent to the impedance of said voltage dividing circuit, and is inserted between said differential amplifier and an input end of the reference voltage.

17. The differential operational amplifier circuit as claimed in claim 11, wherein a first pole in a common-mode loop transfer function is dominantly caused by a pole attributable to said impedance circuits and said capacitive element in said voltage dividing circuit.

18. The differential operational amplifier circuit as claimed in claim 11, wherein a first zero in a common-mode loop transfer function is dominantly caused by a zero attributable to said voltage dividing circuit, and is located in the vicinity of or on a low frequency side of a unity gain frequency.

* * * * *